United States Patent [19]

Kamata

[11] Patent Number: 4,728,622
[45] Date of Patent: Mar. 1, 1988

[54] CHARGE TRANSFER DEVICE HAVING A WIDTH CHANGING CHANNEL

[75] Inventor: Takao Kamata, Tokyo, Japan

[73] Assignee: NEC Corporation, Tokyo, Japan

[21] Appl. No.: 42,091

[22] Filed: Mar. 12, 1987

Related U.S. Application Data

[62] Division of Ser. No. 703,556, Feb. 20, 1985, abandoned.

[30] Foreign Application Priority Data

Feb. 23, 1984 [JP] Japan .................................. 59-32854

[51] Int. Cl.$^4$ ........................................... H01L 29/78
[52] U.S. Cl. ...................................... 437/44; 437/53; 357/24
[58] Field of Search ............... 437/44, 53 (U.S. only); 29/571

[56] References Cited

U.S. PATENT DOCUMENTS 4,262,217 4/1981 Levine .................................. 357/24

FOREIGN PATENT DOCUMENTS 53-84488 7/1978 Japan .................................. 357/24
2010010 6/1979 United Kingdom .................. 357/24

Primary Examiner—Olik Chaudhuri
Attorney, Agent, or Firm—Burns, Doane, Swecker & Mathis

[57] ABSTRACT

A charge transfer device includes a semiconductor substrate, a channel region formed on the semiconductor substrate and having a wide part, a narrow part and a contact portion contacting the wide and narrow part to form a path of charges being transferred from the wide part to the narrow part and a plurality of transfer electrodes formed on the semiconductor substrate to cover the channel region, the contact portion being located under an edge of one of transfer electrodes on the side of charge transfer direction.

4 Claims, 7 Drawing Figures

CHARGE TRANSFER DEVICE HAVING A WIDTH CHANGING CHANNEL

This application is a division of application Ser. No. 703,556, filed Feb. 20, 1985, now abandoned.

BACKGROUND OF THE INVENTION

1. Field of the Invention

This invention relates to a structure of a charge transfer device such as a charge-coupled device, and more particularly to the charge transfer device having such a channel region that its width is reduced along the charge transferring direction.

2. Description of the Prior Art

The charge transfer device is a device transferring charges through a semiconductor channel region. Such charge transfer devices can be classified by the types of channel regions into a surface channel type in which charges are transferred along the surface region and a buried channel type in which charges are transferred through inside the semiconductor body. The channel region of the surface channel type is defined by channel stopper region surrounding the channel region and/or thinn oxide film interposed between the semiconductor substrate and transfer electrodes. The channel region of the buried channel type is also defined by the channel stopper region and by the impurity region formed in a semiconductor substrate having the conductivity type opposite to the impurity region. The potential at the channel region generated by the clock pulses applied to the transfer electrodes depends on the channel width. While the generated potential is high at the wide channel region, it is low at the narrow channel region. This dependency might be an affection from the channel stopper region held at a constant reference voltage. If the channel is narrow, the potential change is restrained by the reference voltage Therefore, if the width of the channel region is reduced along the charge transfer direction under one transfer electrode, a potential barrier is produced at the width reduced portion. Some charges to be transferred are remained by the potential barrier, resulted in a deterioration of charge transfer efficiency. This phenomenon equally appears on the surface and buried channel type devices.

SUMMARY OF THE INVENTION

The primary object of the invention is to provide a charge transfer device having an improved charge transfer efficiency in spite that the channel width is reduced along the charge transfer direction.

According to the present invention, there is provided a charge transfer device comprising a semiconductor substrate having a channel region through which charges are transferred and a plurality of transfer electrodes formed on the semiconductor substrate over the channel region through an insulating film, the channel region having a wide part, a narrow part and a connecting portion at which the wide and narrow parts are connected to form a path of charges transferring from the wide part to the narrow part, and a predetermined transfer electrodes having an edge on a side of a charge transfer direction which coincides with the connecting portion in plan view. The wide part of the channel region is corrected, to coincide the connecting portion with the edge of the predetermined transfer electrode, by an impurity implantation using the predetermined transfer electrode as a mask.

The position of the edge of the predetermined transfer electrode coincides with the connecting portion where the wide and narrow parts are connected. Therefore, the channel potentials under all the transfer electrode are respectively uniform. Therefore, any potential barrier is not generated under all the transfer electrodes. All the charges to be transferred are smoothly transferred from the predetermined transfer electrode to the next transfer electrode without being barred by the potential barrier.

Such alignment of the edge of the predetermined transfer electrode and the connecting portion where the wide and narrow parts are connected may be easily formed by implanting impurities of the same conductivity type as the semiconductor substrate with a use of the predetermined transfer electrode as a mask. The next transfer electrode is formed after the introduction of impurities.

The structure according to the present invention is equally applicable to the surface channel type and to the buried channel type. Both channel types define the channel regions with channel stoppers. The present invention may be produced by introducing impurities into both channel type devices.

BRIEF DESCRIPTION OF THE DRAWINGS

The above and further objects, features and advantages of the present invention will become more apparent from the following detailed description of embodiments taken in conjunction with the accompanying drawings, wherein:

FIG. 1 shows a four-phase drive charge transfer device. Channel regions 1 and 2 of N-type is formed in a P-type semiconductor substrate 10. The channel region 1 is wider than the channel region 2. These channel regions 1 and 2 are connected at the portion 3. A channel stopper region of P+-type is formed outside the channel regions 1 and 2. A plurality of transfer electrodes 11, 12, 13 and 14 are formed on the semiconductor substrate 10 through an insulating film (not shown) and across the channel regions 1 and 2. The portion 3 positions under one of the transfer electrodes 14. Four phase clock pulses $\phi_1$, $\phi_2$, $\phi_3$ and $\phi_4$ are respectively applied to the transfer electrodes 11, 12, 13 and 14. Charges are transferred through the channel regions 1 and 2 in the direction shown by an arrow 4.

Figure 2:
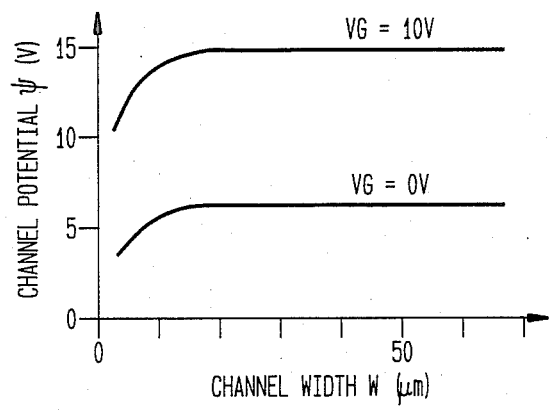
FIG. 2 is a graph showing the relationship between the channel width and the channel potential.

By the potential of the clock pulses $\phi_1$, $\phi_2$, $\phi_3$ and $\phi_4$, channel potentials are produced at the corresponding parts of the channel regions 1 and 2. The channel potential is affected not only from the clock pulses $\phi_1$, $\phi_2$, $\phi_3$ and $\phi_4$ but also from the channel width. The affection from the channel width is shown in FIG. 2 which is a case where the impurity concentration of the semiconductor substrate is $1\times10^{15}$ cm$^{-3}$ and the depth and impurity concentration of the channel regions 1 and 2 are 1 μm and $2\times10^{16}$ cm$^{-3}$. The channel potentials produced by the clock pulses of 10 volts and zero volt are shown. The channel potentials are almost uniform where the channel width is larger than 15 μm. However, if the channel width becomes narrower than 15 μm, the channel potentials lower. This critical point where the tedency of the channel potential is changed becomes higher if the depths of the channel regions 1 and 2 become deeper. For example, when the depth and impurity concentration of the channel regions 1 and 2 are 1.5 μm and $1\times10^{16}$ cm$^{-3}$, the critical point is 25 μm.

Figure 1:
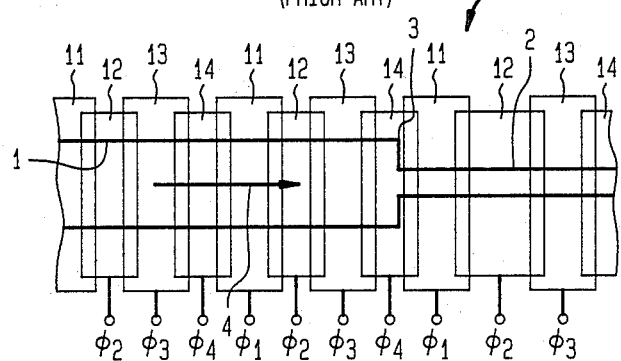
FIG. 1 is a plan view of the charge transfer device in the prior art.
Figure 3A:
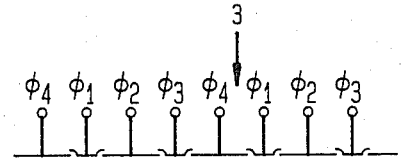
FIGS. 3(a), 3(b) and 3(c) are schematical views showing a mechanism of charge transfer according to the charge transfer device in the prior art.
Figure 3B:
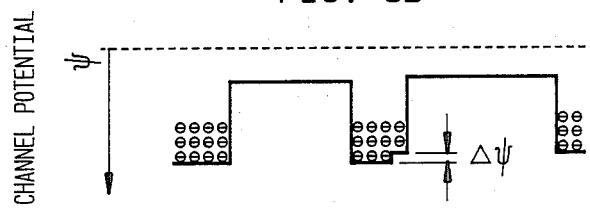
Figure 3C:
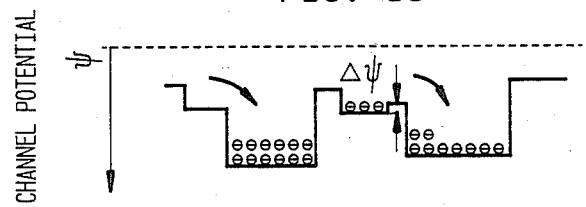

As apparent from FIG. 2, if the channel width is reduced under one transfer electrode along the charge transfer direction, a potential barrier is produced to bar the charge transfer. Such phenomenon will be explained with reference to FIGS. 3(a) to 3(c). FIG. 3(a) is a schematical diagram of transfer electrodes 11 to 14 of FIG. 1 for making the position of potentials shown in FIGS. 3(b) and 3(c) clear. The portion 3 correspondes to the connecting point of channel regions 1 and 2 of FIG. 1. FIG. 3(b) shows the state when charges are stored in the potential well under the transfer electrode to which the clock pulse $\phi_4$ is applied. Although a potential step $\Delta\psi$ exists at the portion 3, such potential step $\Delta\psi$ does not produce any problem at this state. FIG. 3(c) shows a state when charges are transferred from the potential well under the transfer electrode to which the clock pulse $\phi_4$ is applied to the potential well under the transfer electrodes to which the clock pulses $\phi_1$ and $\phi_2$ are applied. The potential step $\Delta\psi$ of 1.2 volts operates as a potential barrier and remains some charges. Those remained charges are a cause of the deterioration of charge transfer efficiency.

DESCRIPTION OF THE PREFERRED EMBODIMENT

Now one preferred embodiment of the present invention will be explained with reference to FIGS. 4(a) and 4(b). A P-type silicon substrate 20 having an impurity concentration of $1\times10^{15}$ cm$^{-3}$ is prepared. N type impurities are implanted to form channel regions 21 and 22 having an impurity concentration of $2\times10^{16}$ cm$^{-3}$ and a depth of 1.0 μm. The channel region 21 has a width W$_1$ of 20 μm and the other channel region 22 has a width W$_2$ of 7 μm. These channel regions 21 and 22 contact at a portion 23. Boron is then implanted into the surface region of the substrate 20 to form a P$^+$-type channel stopper region having an impurity concentration of $5\times10^{17}$ cm$^{-3}$ and surrounding the channel regions 21 22. A thin silicon oxide film of 1,000 Å is grown on the channel regions 21 and 22 by a thermal oxidation process. A plurality of transfer electrodes 51 and 53 are formed on the silicon oxide film to cover the channel regions 21 and 22 by a deposition of polycrystalline silicon. Here, the transfer electrodes 51 and 53 should be arranged so that the portion 23 is located between any one couple of transfer electrodes 51 and 53.

Figure 4A:
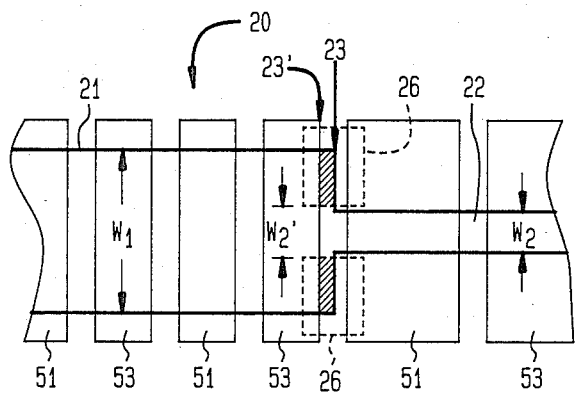
FIGS. 4(a) and 4(b) are plan views showing the charge transfer device according to the present invention, FIG. 4(a) showing a procedure of an introduction of impurities to correct the portion of channel region where the channel width is reduced, and FIG. 4(b) showing a procedure after all the transfer electrodes are formed.
Figure 4B:
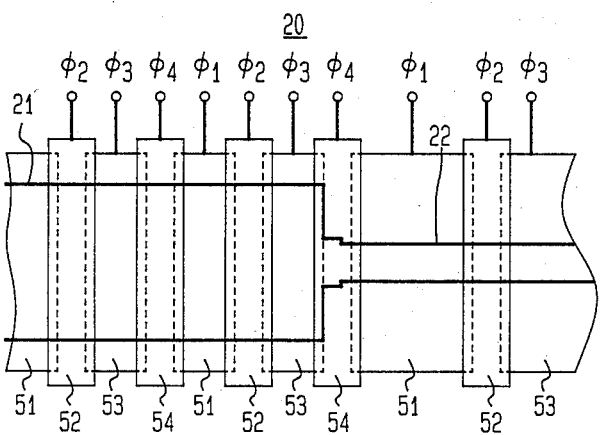

After the formation of transfer electrodes 51 and 53, boron is implanted with a does of $6\times10^{11}$ cm$^{-2}$ at the portions enclosed by dotted lines 26 in FIG. 4(a). During this implantation process, the transfer electrodes 51 and 53 operates as a mask for the boron implantation. The hatched parts are transformed into a P$^+$-type channel stopper regions having an impurity concentration of about $7\times10^{16}$ cm$^{-3}$ to extend the narrow channel region 22 to the portion 23' which correspondes to the right side edge of the transfer electrode 53. The width W'$_2$ of the extended narrow channel region 22 is difficult to coincide with, the width W$_2$. A little mismatching of the widths W'$_2$ and W$_2$ does not cause any problem. The selective implantation may be achieved by covering photo-resist outside the portions enclosed by the dotted lines 26 or by selectively scanning the ion beam.

Next, after the silicon oxide film between the transfer electrodes 51 and 53 is once removed to expose the channel regions 21 and 22, new silicon oxide film of 1,000 Å is regrown by another thermal oxidation. The surfaces of the transfer electrodes 51 and 53 are simultaneously covered with silicon oxide films. On the new silicon oxide film, the transfer electrodes 52 and 54 are formed by a deposition of polycrystalline silicon. Four phase clock pulses are applied to the transfer electrodes 51 to 54 to transfer charges from left to right through the channel regions 21 and 22.

Thus explained, the width of the channel region is reduced at the portion 23' which correspondes to the edge of the transfer electrode 53 on the side of charge transfer direction. In other words, the width of channel region is uniform under any transfer electrodes 51 to 54, causing no potential step under any transfer electrodes 51 to 54. Therefore, any potential barrier is not produced in the path of charge flow. The charge transfer efficiency is not deteriorated. It is noted that, although the channel potential at the narrow channel region 22 is lowered due to the narrow width, this lowering does not affect the high charge transfer efficiency, because all the channel potential under the transfer electrodes 51 to 54 are uniform.

The affection of the channel width to the channel potential is seen where the channel width of the narrower channel region 22 is less than 25 μm for the channel region depth of about 1.5 μm and less than 15 μm for the channel region depth of about 1.0 μm. The present invention is effectively applicable to the charge transfer devices that the width of channel region is reduced in the charge transfer direction and that the narrower channel width is less than 25 μm, and more particularly less than 15 μm.

In the above, the present invention was explained with reference to a buried channel type charge transfer device. The present invention is equally applicable to the surface channel type charge transfer device. The channel region of the surface channel type device is defined by the channel stopper region, similar to the buried channel type device. Therefore, the reduced portion of channel width may be similarly aligned with the edge of the transfer electrode on the side of charge transfer direction by ion implantation as explained with reference to FIG. 4(a). As the clock pulses, three-phase or two-phase pulses may be similarly employed.

What is claimed is:

1. A method for manufacturing a charge transfer device comprising steps of:
    forming a channel region in a semiconductor substrate of one conductivity type, said channel region having a wide part and a narrow part, said wide and narrow parts contacting with each other at a contact portion to form a path of charges transferring from said wide part to said narrow part;

forming a first set of transfer electrodes on said semiconductor substrate to cover said channel region, said contact portion being arranged to be positioned between predetermined two of said first set of transfer electrodes;

introducing impurities of said one conductivity type into said semiconductor substrate between said predetermined two of said transfer electrodes to extend said narrow part of said channel region to an edge of one of said predetermined two of said transfer electrodes; and forming a second set of transfer electrodes on said semiconductor substrate between said first set of transfer electrodes to cover said channel region.

2. A method for manufacturing the charge transfer device as claimed in claim 1, wherein said impurities are introduced into said semiconductor substrate between said predetermined two of said transfer electrodes by an ion implantation technique.

3. A method for manufacturing the charge transfer device as claimed in claim 2, wherein said narrow part of said channel region has a width less than 25 $\mu$m.

4. A method for manufacturing the charge transfer device as claimed in claim 2, wherein said narrow part of said channel region has a width less than 15 $\mu$m.

* * * * *